(12) United States Patent
Yamada et al.

(10) Patent No.: US 11,552,174 B2
(45) Date of Patent: Jan. 10, 2023

(54) COMPOUND SEMICONDUCTOR AND METHOD FOR PRODUCING THE SAME

(71) Applicant: JX NIPPON MINING & METALS CORPORATION, Tokyo (JP)

(72) Inventors: Kohei Yamada, Kitaibaraki (JP); Koji Murakami, Kitaibaraki (JP); Kenya Itani, Kitaibaraki (JP)

(73) Assignee: JX NIPPON MINING & METALS CORPORATION, Tokyo (JP)

( * ) Notice: Subject to any disclaimer, the term of this patent is extended or adjusted under 35 U.S.C. 154(b) by 118 days.

(21) Appl. No.: 16/498,712

(22) PCT Filed: Sep. 14, 2018

(86) PCT No.: PCT/JP2018/034260
§ 371 (c)(1),
(2) Date: Sep. 27, 2019

(87) PCT Pub. No.: WO2019/155674
PCT Pub. Date: Aug. 15, 2019

(65) Prior Publication Data
US 2021/0111252 A1    Apr. 15, 2021

(30) Foreign Application Priority Data

Feb. 9, 2018  (JP) .............................. JP2018-021997

(51) Int. Cl.
*H01L 21/02*    (2006.01)
*H01L 29/04*    (2006.01)
*H01L 29/22*    (2006.01)

(52) U.S. Cl.
CPC .... *H01L 29/2203* (2013.01); *H01L 21/02562* (2013.01); *H01L 21/02609* (2013.01); *H01L 21/02636* (2013.01); *H01L 29/045* (2013.01)

(58) Field of Classification Search
None
See application file for complete search history.

(56) References Cited

U.S. PATENT DOCUMENTS 4,960,721 A      10/1990  Terashima et al.
9,362,431 B2 *   6/2016   Noda ................... H01L 31/1832
(Continued)

FOREIGN PATENT DOCUMENTS

CN    101092748 A    12/2007
CN    102157601 A    8/2011
(Continued)

OTHER PUBLICATIONS

European Search Opinion for EP 18904520 (EP 3584356 A1) (Year: 2020).*

(Continued)

*Primary Examiner* — Telly D Green
(74) *Attorney, Agent, or Firm* — Birch, Stewart, Kolasch & Birch, LLP

(57) ABSTRACT

Provided is a cadmium zinc telluride (CdZnTe) single crystal including a main surface that has a high mobility lifetime product ($\mu\tau$ product) in a wide range, wherein the main surface has an area of 100 mm² or more and has 50% or more of regions where the $\mu\tau$ product is $1.0 \times 10^{-3}$ cm²/V or more based on the entire main surface, and a method for effectively producing the same.

3 Claims, 2 Drawing Sheets

(56) References Cited

U.S. PATENT DOCUMENTS

| | | | | |
|---|---|---|---|---|
| 2007/0036700 A1* | 2/2007 | Redden | ............... | C01B 19/002 423/99 |
| 2008/0102022 A1* | 5/2008 | Arakawa | ............... | C30B 11/00 423/508 |
| 2011/0186788 A1 | 8/2011 | Hackenschmied et al. | | |
| 2016/0056313 A1* | 2/2016 | Noda | ............... | C30B 11/002 250/370.01 |
| 2018/0127892 A1* | 5/2018 | Murakami | ............ | C30B 33/02 |

FOREIGN PATENT DOCUMENTS

| | | | |
|---|---|---|---|
| EP | 0 316 161 A2 | | 5/1989 |
| EP | 0 627 506 A1 | | 12/1994 |
| JP | 1-264990 A | | 10/1989 |
| JP | 2013-241289 A | | 12/2013 |
| JP | 2013241289 A | * | 12/2013 |
| JP | 2014-196213 A | | 10/2014 |
| JP | 2016040524 A | * | 3/2016 |
| JP | 2016-153362 A | | 8/2016 |
| JP | 2016-207752 A | | 12/2016 |
| WO | WO-9522643 A1 | * | 8/1995 ............. C30B 29/48 |

OTHER PUBLICATIONS

International Preliminary Report on Patentability and English translation of the Written Opinion of the International Searching Authority (Forms PCT/IB/338, PCT/IB/373, and PCT/ISA/237) for International Application No. PCT/JP2018/034260, dated Aug. 20, 2020.
Eisen et al., "CdTe and CdZnTe materials for room-temperature X-ray and gamma ray detectors", Journal of Crystal Growth, 1998, vol. 184/185, pp. 1302-1312.
International Search Report, issued in PCT/JP2018/034260, dated Oct. 23, 2018.
Xu et al., "Characterization of CdZnTe Crystals Grown Using a Seeded Modified Vertical Bridgman Method", IEEE Transactions On Nuclear Science, Oct. 2009, vol. 56, No. 5. pp. 2808-2813.
Extended European Search Report for corresponding European Application No. 18904520.6, dated Dec. 18, 2020.
Vadawale et al., "Experimental measurements of charge carrier mobility—lifetime products for large sample of pixilated CZT detectors," Proceedings of SPIE, vol. 8453, Sep. 25, 2012, pp. 84532K-1-84532K-9.

* cited by examiner

[FIG. 1]
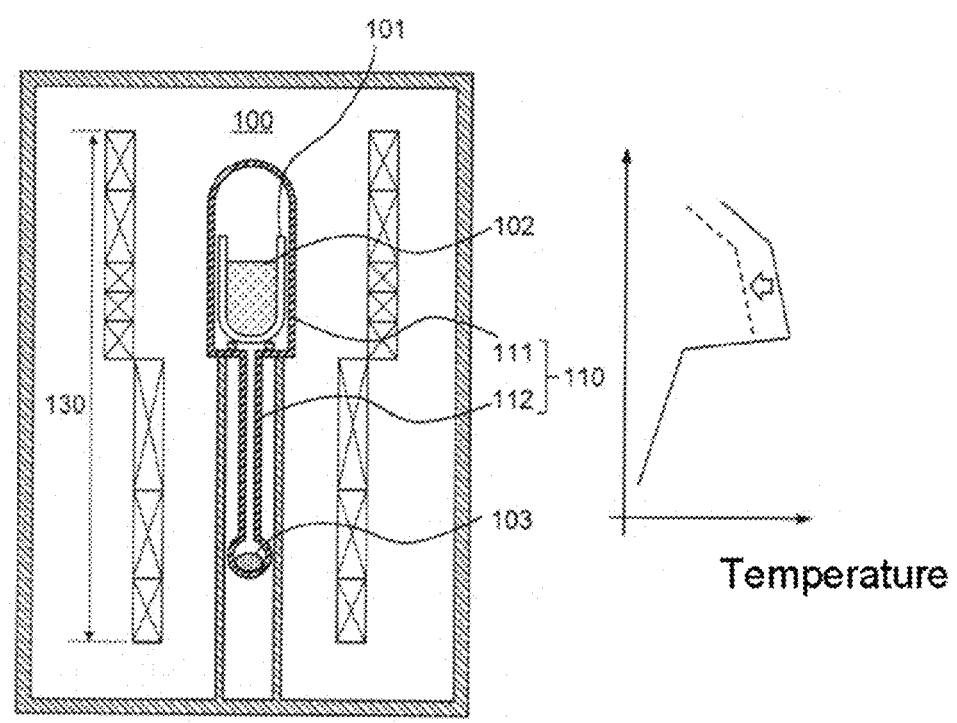

[FIG. 2]
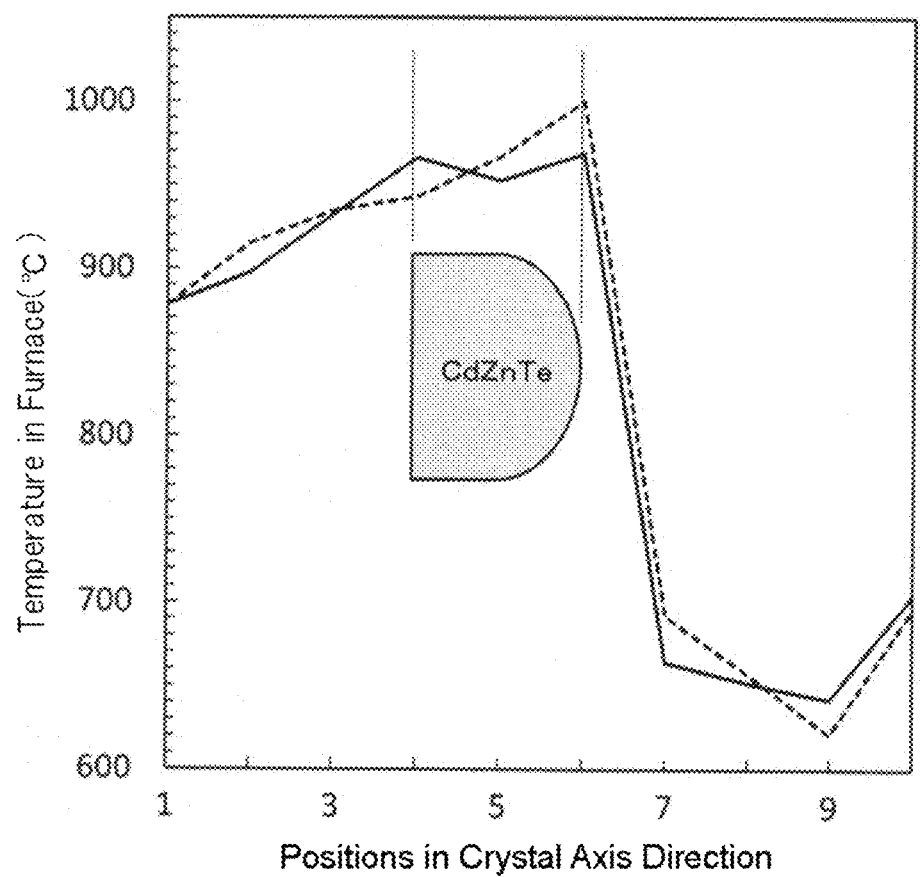

COMPOUND SEMICONDUCTOR AND METHOD FOR PRODUCING THE SAME

TECHNICAL FIELD

The present invention relates to a cadmium zinc telluride (CdZnTe) single crystal that is a compound semiconductor, and a method for producing the same.

BACKGROUND ART

Cadmium telluride (CdTe) which is a group II-VI compound of cadmium (Cd) that is a group II (Group 2B) element and tellurium (Te) that is a group VI (Group 6B) element has a relatively large band gap (up to 1.44 eV). Further, cadmium zinc telluride (CdZnTe) having a further increased band gap by replacing a part of Cd of CdTe with zinc (Zn) that is an element belonging to the same group is also a group II-VI semiconductor material similar to CdTe. It is widely used for various applications utilizing its characteristics.

Generally, light incident on a semiconductor material excites a part of electrons in the semiconductor, and if an energy (photon energy) of light is larger than a band gap of the semiconductor, electrons existing in a valence band will transition beyond a forbidden band to generate positive holes in the valence band, so that a movable charge (carrier) pair is generated. The phenomenon that carriers are generated in the semiconductor material by the incidence and irradiation of light is referred to as a (internal) photoelectric effect. The carriers generated by the photoelectric effect disappear due to charge recombination or the like after a predetermined period of time is passed. The time until this disappearance is referred to as "lifetime" of the carriers.

As described above, if the movable carriers generated by the photoelectric effect are taken out as current in the form of an electric signal, applications as various semiconductor devices utilizing the photoelectric effect will be possible. In this case, a degree of a collection efficiency of the carrier that can be taken out as an electric signal can be evaluated by a mobility lifetime product ($\mu\tau$ product) which is a product of the lifetime ($\tau$) of the carrier as described above and a mobility ($\mu$) which is ease of movement of the carrier in the semiconductor material. That is, the semiconductor material having a higher $\mu\tau$ product can be a semiconductor material having a higher carrier collection efficiency, which also can improve performance of a device.

Since the carrier mobility ($\mu$) and the carrier lifetime ($\tau$) of the semiconductor as stated above are characteristics significantly affected by crystallinity of the semiconductor material and a state relating to impurities, respectively, the index of the $\mu\tau$ product which is a product of them can be regarded as an index that is inherent to a material and multiply reflects characteristics as semiconductor materials. Therefore, the $\mu\tau$ product can be used as an index for evaluating an inherent performance of a semiconductor material as a material.

From such a point of view, for CdZnTe, the $\mu\tau$ product can be an index capable of evaluating the performance of CdZnTe as a semiconductor material. Prior arts referring to the $\mu\tau$ product of the CdZnTe material can include the following Patent documents and the like.

CITATION LIST

Patent Literatures

Patent Document 1: Japanese Patent Application Publication No. 2013-241289 A

Patent Document 2: Japanese Patent Application Publication No. 2016-153362 A

SUMMARY OF INVENTION

Technical Problem

As described above, the $\mu\tau$ product in the semiconductor material is a characteristic that varies depending on the crystallinity, the state relating to impurities, and the like. The crystal of CdZnTe which is a mixed crystal compound of group II-VI containing plural kinds of group II elements is one of crystalline substances which are difficult to grow stably a bulk crystalline body having constant and uniform crystal characteristics in a wide range. In such a CdZnTe crystal, processing conditions during or after crystal growth sensitively act to the state of the crystal, so that a slight difference in processing conditions will appear as a large difference in crystal characteristics. Therefore, the actual CdZnTe crystal may cause a problem that even if it is a crystal material cut out from a region having the same solidification rate of the same crystal ingot, the $\mu\tau$ products are different depending on local crystal sites.

Therefore, the CdZnTe crystal will be required not only to obtain a crystal with a high $\mu\tau$ product, but also at the same time to expand a crystal region capable of obtaining the high $\mu\tau$ product as wide as possible. Even if a region with a desired high $\mu\tau$ product is locally obtained on only a part of a surface of the cut crystal, many parts of the crystal cannot be used if there are many regions that do not reach the desired $\mu\tau$ product, leading to a significantly low yield.

The present invention has been made based on the above problems. An object of the present invention is to provide a CdZnTe single crystal material that achieves a high $\mu\tau$ product and at the same time has a higher ratio of regions where the high $\mu\tau$ product is achieved, on the same crystal material surface.

Solution to Problem

As a result of extensive studies by the present inventors to solve the above technical problems, the present inventors have found that the $\mu\tau$ product in the CdZnTe single crystal is affected by conditions of a heat treatment temperature during a heat treatment performed after crystal growth, in addition to the conditions during the crystal growth, which are also greatly involved in a large or small size of the region having the high $\mu\tau$ product, and that appropriate and strict control of those conditions achieve the high $\mu\tau$ product as well as provide a crystal material having the high $\mu\tau$ product in a wide range, and have completed the present invention.

Based on the above findings, the present disclosure provides the following inventions:

1) A cadmium zinc telluride (CdZnTe) single crystal, the single crystal having at least one main surface, the at least one main surface having an area of 100 mm$^2$ or more, and the at least one main surface comprising 50% or more of regions where a mobility lifetime product ($\mu\tau$ product) is 1.0×10$^{-3}$ cm$^2$/V or more, based on the entire main surface.

2) The cadmium zinc telluride single crystal according to 1), wherein a ratio of Zn in group II elements is from 2.0 at % to 10.0 at %.

3) The cadmium zinc telluride single crystal according to 1) or 2), wherein the main surface has a {111} plane orientation.

4)

A method for producing the cadmium zinc telluride single crystal according to any one of 1) to 3), the method comprising: growing a cadmium zinc telluride crystal ingot; heating the grown cadmium zinc telluride crystal ingot as an ingot; and cutting out a single crystal from the heated cadmium zinc telluride crystal ingot so as to have at least one main surface of a predetermined plane orientation, wherein a temperature of the heating is 800° C. or higher and 1000° C. or lower, and wherein a difference between a maximum temperature and a minimum temperature in a region between an upper end portion and a lower end portion of the single crystal ingot is within 20° C.

5) The method according to 4), wherein the growing of the cadmium zinc telluride crystal ingot is carried out by a vertical temperature gradient freeze (VGF) method.

6) The method according to 4) or 5), wherein the heating of the cadmium zinc telluride crystal ingot is continuously carried out in a furnace in which the single crystal ingot has been grown, after growing the single crystal ingot.

Advantageous Effects of Invention

According to the technique of the present disclosure, it is possible to achieve both of a higher $\mu\tau$ product in the CdZnTe single crystal material and an increase in a ratio of regions having the higher $\mu\tau$ product in the same surface, so that a large number of single crystal substrates having the high $\mu\tau$ product can be collected from the same crystal surface, or the single crystal can be used as a large area single crystal substrate having the high $\mu\tau$ product. Therefore, it is possible to improve a production efficiency and a product yield of device products using the CdZnTe single crystal, thereby reducing product costs.

BRIEF DESCRIPTION OF DRAWINGS

FIG. 1 is a view showing an example of a CdZnTe crystal growth furnace used in the present invention.

FIG. 2 is a graph showing an example of temperature distribution during heating.

DESCRIPTION OF THE PREFERRED EMBODIMENTS

A CdZnTe single crystal according to the present disclosure is a single crystal material containing at least cadmium (Cd), zinc (Zn), and tellurium (Te) as constituent elements, and it may optionally contain a dopant element(s) other than those. Although a shape of the single crystal material is not particularly limited, the single crystal has at least one main surface. Such a shape of the crystal includes a plate-shaped substrate or a wafer shape having a thickness of a predetermined thickness (for example, but not limited to, 500 µm or more). As used herein, the "main surface" refers to a surface having the maximum area, among surfaces which are exposed on the crystal material and which can be recognized as a plane.

The CdZnTe single crystal according to the present disclosure has features that an area of the main surface is at least 100 mm² or more, and a region where the $\mu\tau$ product is $1.0\times10^{-3}$ cm²/V or more is 50% or more of the entire main surface in the CdZnTe single crystal is small, it is not technically difficult to set a ratio of the regions having the high $\mu\tau$ product such as $1.0\times10^{-3}$ cm²/V or more to 100% or a value close thereto.

However, in light of common general technical knowledge, it is clear that it is technically difficult to increase the ratio of the regions having the high $\mu\tau$ product at the above level over a wide range of the main surface of the CdZnTe single crystal having a higher main surface to some extent.

In the present disclosure, a range of 100 mm² or more is set as a reference of the size of such a main surface. The size of the reference main surface may be 400 mm² or more, or 1000 mm² or more, or even 10000 mm² or more, depending on the embodiments. It would be easily understood that it is technically difficult to increase the ratio of the regions having the high $\mu\tau$ product such as $1.0\times10^{-3}$ cm²/V or more as the area lower limit value of the reference main surface is larger.

Further, in the present disclosure, the range of $1.0\times10^{-3}$ cm²/V or more is set as an index of the "high $\mu\tau$ product" in the CdZnTe single crystal material, taking the state of the art for the CdZnTe single crystal material and the like into account. In the CdZnTe single crystal according to the present disclosure, a region having a $\mu\tau$ product of $1.0\times10^{-3}$ cm²/V or more, which can be the "high $\mu\tau$ product", has an area ratio of 50% or more based on the entire area of the main surface. The higher area ratio is preferable, and the area ratio may be 60% or more, or 70% or more, depending on the embodiments.

The CdZnTe single crystal in the present disclosure is obtained by substituting a part of Cd of CdTe with Zn that is an element belonging to the same group (Group II). The substitution ratio, that is, a ratio of Zn atoms in the group II elements, represented by the following equation (1), can be in a range of from 2.0 at % to 10.0 at %. This range can allow adjustment to a band gap suitable for application to useful devices utilizing the photoelectric effect, in particular, detectors for radiation including X-rays. A lower limit of the ratio of Zn atoms in the group II elements may be 3.0 at %, or 4.0 at %, depending on the embodiments, and an upper limit may be 7.0 at %, or 6.0 at %. In the CdZnTe single crystal material according to the present disclosure, the concentrations of Cd and Zn (the number of atoms per unit region) can be analyzed by near-infrared (NIR) spectroscopy to calculate the ratio of Zn atoms in the group II elements.

$$\{Zn/(Cd+Zn)\}\times 100 \text{ (at \%)} \tag{1}$$

in which each of Cd and Zn represents each number of atoms of Cd and Zn in the CdZnTe single crystal.

The plane orientation of the main surface of the CdZnTe single crystal can be set according to applications and required characteristics. In the present disclosure, it can be set to a plane such as {111}, for example. By setting such a plane orientation, the single crystal can be used as a general-purpose semiconductor substrate, as well as it also can exhibit preferable characteristics in applications such as radiation detectors.

The CdZnTe single crystal according to the present invention is specified by a structure and a characteristic as a product having the main surface in which at least an area is 100 mm² or more and the region where the mobility lifetime product ($\mu\tau$ product) is $1.0\times10^{-3}$ cm²/V or more is 50% of the entire main surface. The method for producing the single crystal is not particularly limited as long as it can obtain the above characteristics. However, when producing the CdZnTe single crystal by a production method including performing a predetermined heat treatment after growing the CdZnTe crystal, the conditions of the heat treatment greatly affect the $\mu\tau$ product of the CdZnTe single crystal, so that those conditions are preferably controlled in order to obtain the CdZnTe single crystal according to the present invention effectively.

More particularly, after growing an ingot of CdZnTe crystal by a certain method, the heat treatment of the CdZnTe crystal is performed in the state of the ingot. In this case, the heat treatment is controlled such that a temperature of the heat treatment is 800° C. or higher and 1000° C. or lower, and a difference between the maximum temperature and the minimum temperature in a region between an upper end portion and a lower end portion of the CdZnTe crystal ingot is within 20° C., whereby the CdZnTe single crystal according to the present disclosure can be effectively produced. The temperature of the heat treatment may be 900° C. or higher.

The heat treatment itself after growing the CdZnTe crystal is a known technique that has been conventionally performed. Generally, during growth of a bulk crystal ingot including CdZnTe, a slight change of a temperature has been sensitively reflected in characteristics such as crystallinity of a crystal to be grown, so that strict temperature control has been performed. However, the heat treatment after crystal growth has been often performed for the purpose of improving crystal defects and of having uniform impurity distribution, and the like, and it has been believed that the heat treatment has cause no problem as long as it has been carried out in such a temperature range that excitation of required lattice vibration or diffusion of impurities has been facilitated and dissociation of crystal elements or melting of the crystal material has not been generated.

In fact, it would not be practical that strict temperature control is performed such that the temperature difference of the entire crystal ingot is from about several ° C. to about 20° C. in an environment where the heat treatment is carried out after growing the crystal ingot in a high temperature range such as from 800 to 1000° C., in view of repair and investment of equipment required for doing the temperature control, an efficiency and production cost of the crystal, and the like. However, as a result of detailed analysis and investigation by the present inventors, they have found that a slight difference in the heat treatment condition to be carried out after the growth of the crystal ingot significantly contributes to the ratio of the region having the high $\mu\tau$ product in the resulting single crystal, in the production of the CdZnTe single crystal.

Although details of the reason why the ratio of the region having the high $\mu\tau$ product can be increased by maintaining the temperature difference in the entire crystal ingot within the range of 20° C. or less during the heat treatment is not clearly known, it is believed that one of the factors is an ability of the heat treatment under the condition of the small temperature difference in the crystal to promote significantly a degree of improvement of the ununiformity of the element concentration locally generated in the crystal due to precipitation of Te and deviation of Zn during the CdZnTe crystal growth.

The growth of the CdZnTe crystal ingot to be subjected to the above heat treatment can be carried out by any known method such as a vertical temperature gradient freeze (VGF) method, a vertical bridgman (VB) method, a kyropulos method, and the like. Among these methods, the VGF method is suitable to grow the CdZnTe crystal ingot as a method capable of efficiently applying the above heat treatment after growing the crystal ingot. The specific growth method and growth conditions of the CdZnTe crystal ingot by the VGF method are known as disclosed in Patent Documents 1 and 2, and the like. In the art according to the present disclosure, the CdZnTe crystal ingot may be grown by a method and means in accordance with these prior arts.

Further, the above heat treatment can be continuously carried out as it is in a furnace in which the crystal ingot has been grown, after growing the CdZnTe crystal ingot. This can allow minimization of a temperature change received by the crystal ingot after the growth of the CdZnTe crystal ingot until the start of the heat treatment, and can allow efficient progress of the single crystal producing process in a short period of time.

EXAMPLES

Hereinafter, the present invention will be specifically described based on Examples and Comparative Examples. The descriptions of Examples and Comparative Examples as described below are merely specific examples for facilitating understanding of the technical contents of the present invention and the technical scope of the present invention is not limited by these specific examples.

Example 1

First, a CdZnTe crystal ingot was grown by the VGF method. Using a crystal growth furnace as shown in FIG. 1, raw materials were filled in a pBN crucible having an inner diameter of 5 inches (about 127 mm) disposed in a crystal growth portion of a quartz ampule as a growth vessel, so as to have a composition of $Cd_{0.95}Zn_{0.05}Te$ (Zn in Group II elements: 5 at %) in atomic ratio. Further, Cd for atmospheric vapor pressure control was separately placed in a reservoir portion of the quartz ampoule, and the quartz ampoule was vacuum-sealed. The quartz ampoule was attached to the inside of the crystal growth furnace, and the temperature gradient as shown in FIG. 1 was set and the inside of the furnace was heated. The temperature of the crucible was gradually decreased while maintaining the temperature gradient of the melt at 1.3° C./cm in a state where the raw materials in the crucible were melted, whereby the CdZnTe crystal ingot was grown such that the growth proceeded downward from the melt surface.

Once the bottom of the crucible reached the solidification temperature, the CdZnTe crystal ingot was then heated in the furnace in which the CdZnTe crystal ingot was grown. The temperature distribution along the crystal growth direction near the crystal ingot in the furnace at that time is as indicated by the solid line in FIG. 2. The maximum value of the temperature in the region where the crystal ingot was present was 969.0° C., and the minimum value was 952.7, and a difference between them was 16.3° C. After the heat treatment was carried out for 1200 minutes in this state, the crystal ingot was gradually cooled to room temperature at a cooling rate of 50° C./hr, and the resulting CdZnTe crystal ingot was taken out.

After circumference grinding of the outer periphery of the resulting crystal ingot, the ground crystal ingot was cut into a circular plate wafer shape at a {111} plane perpendicular to the crystal growth direction, and then subjected to surface grinding and polishing. A polycrystalline portion and the like were removed from the wafer-shaped crystal to form a wafer consisting of only a single crystal. The wafer surface of the single crystal wafer in this state will be the surface corresponding to the main surface of the CdZnTe single crystal according the present disclosure. The CdZnTe single crystal wafer in this state was subjected to dicing to obtain a plurality of CdZnTe single crystal substrates.

For each of the plurality of CdZnTe single crystal substrates obtained above, the $\mu\tau$ product was measured as follows. More particularly, as disclosed in Patent Document 2, radiation spectra of cobalt (Co-57) was measured when different bias voltages at two stages (250 V, 500 V, 700 V, and 900 V) were applied using a radiation detector structured by using each sample. A peak position of each spectrum was then measured, and the $\mu\tau$ product of electrons was determined using a predetermined calculation formula. As a result, the total area of the substrate surface having the $\mu\tau$ product of $1.0 \times 10^{-3}$ cm$^2$/V or more relative to the total area of 1485 mm$^2$ of the surfaces of the plurality of CdZnTe single crystal substrates was 810 mm$^2$. That is, in the CdZnTe single crystal wafer in the state before dicing, the $\mu\tau$ product is $1.0 \times 10^{-3}$ cm$^2$/V or more in the area region of 54.5% among the wafer surfaces. In the wafer, an average value of the Zn concentrations in the group II elements was 5.2 at %.

Example 2

A CdZnTe crystal ingot was grown under the same conditions as those of Example 1, and the CdZnTe crystal ingot was then heated in the same furnace. In Example 2, the maximum value of the temperature during the heat treatment in the region where the crystal ingot was present was 968.8° C., and the minimum value was 952.0° C., and a difference between them was 16.8° C. After the heat treatment was carried out for 1200 minutes in this state, the crystal ingot was gradually cooled to room temperature in the same method as that of Example 1, taken out, cut out into a circular plate wafer shape at a {111} plane, and then subjected to surface grinding and polishing. Subsequently, a polycrystalline portion and the like were removed from the wafer-shaped crystal to form a wafer consisting of only a single crystal.

Further, as in Example 1, the CdZnTe single crystal wafer was subjected to dicing to obtain a plurality of CdZnTe single crystal substrates, and the $\mu\tau$ product of each CdZnTe single crystal substrate was measured. As a result, in Example 2, the total area of the substrate surface having the $\mu\tau$ product of $1.0 \times 10^{-3}$ cm$^2$/V or more relative to the total area of 496 mm$^2$ of the surfaces of the plurality of CdZnTe single crystal substrates was 336 mm$^2$. That is, in the CdZnTe single crystal wafer in the state before dicing, the $\mu\tau$ product is $1.0 \times 10^{-3}$ cm$^2$/V or more in the area region of 67.7% among the wafer surfaces. In the wafer, an average value of the Zn concentrations in the group II elements was 5.1 at %.

Example 3

A CdZnTe crystal ingot was grown under the same conditions as those of Example 1, and the CdZnTe crystal ingot was then heated in the same furnace. In Example 3, the maximum value of the temperature during the heat treatment in the region where the crystal ingot was present was 961.0° C., and the minimum value was 946.0° C., and a difference between them was 15.0° C. After the heat treatment was carried out for 1200 minutes in this state, the crystal ingot was gradually cooled to room temperature in the same method as that of Example 1, taken out, cut out into a circular plate wafer shape at a {111} plane, and then subjected to surface grinding and polishing. Subsequently, a polycrystalline portion and the like were removed from the wafer-shaped crystal to form a wafer consisting of only a single crystal.

Further, as in Example 1, the CdZnTe single crystal wafer was subjected to dicing to obtain a plurality of CdZnTe single crystal substrates, and the $\mu\tau$ product of each CdZnTe single crystal substrate was measured. As a result, in Example 3, the total area of the substrate surface having the $\mu\tau$ product of $1.0 \times 10^{-3}$ cm$^2$/V or more relative to the total area of 112 mm$^2$ of the surfaces of the plurality of CdZnTe single crystal substrates was 80 mm$^2$. That is, in the CdZnTe single crystal wafer in the state before dicing, the $\mu\tau$ product is $1.0 \times 10^{-3}$ cm$^2$/V or more in the area region of 71.4% among the wafer surfaces. In the wafer, an average value of the Zn concentrations in the group II elements was 5.2 at %.

Comparative Example 1

A CdZnTe crystal ingot was grown under the same conditions as those of Example 1, and the CdZnTe crystal ingot was then heated in the same furnace. The temperature distribution along the crystal growth direction near the crystal ingot in the furnace at that time is as indicated by the broken line in FIG. 2. In Comparative Example 1, the maximum value of the temperature during the heat treatment in the region where the crystal ingot was present was 999.8° C., and the minimum value was 943.2° C., and a difference between them was 56.6° C. For comparison, the temperature distribution along the crystal growth direction near the crystal ingot in the furnace in Comparative Example 1 is also shown in FIG. 2. After the heat treatment was carried out for 1200 minutes in this state, the crystal ingot was gradually cooled to room temperature in the same method as that of Example 1, taken out, cut out into a circular plate wafer shape at a {111} plane, and then subjected to surface grinding and polishing. Subsequently, a polycrystalline portion and the like were removed from the wafer-shaped crystal to form a wafer consisting of only a single crystal.

Further, as in Example 1, the CdZnTe single crystal wafer was subjected to dicing to obtain a plurality of CdZnTe single crystal substrates, and the $\mu\tau$ product of each CdZnTe single crystal substrate was measured. As a result, in Comparative Example 1, the total area of the substrate surface having the $\mu\tau$ product of $1.0 \times 10^{-3}$ cm$^2$/V or more relative to the total area of 256 mm$^2$ of the surfaces of the plurality of CdZnTe single crystal substrates was 16 mm$^2$. That is, in the CdZnTe single crystal wafer in the state before dicing in Comparative Example 1, the $\mu\tau$ product of $1.0 \times 10^{-3}$ cm$^2$/V or more can be only achieved in the area region of only 6.3% of the wafer surfaces. In the wafer, an average value of the Zn concentrations in the group II elements was 5.2 at %.

These results are summarized in Table 1.

TABLE 1

|  | Example 1 | Example 2 | Example 3 | Comparative Example 1 |
| --- | --- | --- | --- | --- |
| Maximum Temperature in Crystal (° C.) | 969.0 | 968.8 | 961.0 | 999.8 |
| Minimum Temperature in Crystal (° C.) | 952.7 | 952.0 | 946.0 | 943.2 |
| Temperature Difference in Crystal (° C.) | 16.3 | 16.8 | 15.0 | 56.6 |
| Single Crystal Main Surface Area (mm$^2$) | 1485 | 496 | 112 | 256 |

TABLE 1-continued

|  | Example 1 | Example 2 | Example 3 | Comparative Example 1 |
|---|---|---|---|---|
| Area of μτ ≥10$^{-3}$ Region (mm$^2$) | 810 | 336 | 80 | 16 |
| Area Ratio of μτ ≥10$^{-3}$ Region (%) | 54.5 | 67.7 | 71.4 | 6.3 |

INDUSTRIAL APPLICABILITY

The present disclosure provides a CdZnTe single crystal that achieves a high μτ product in a wide area, and an effective method for producing the same. The art of the present disclosure can provide significant contribution in that a product performance, a product producing efficiency and a yield can be improved in the fields of may semiconductor industries, including various semiconductor devices produced by utilizing characteristics of a CdZnTe single crystal, for example, radiation detectors and infrared detectors such as X-ray detectors utilizing a photoelectric effect capable of obtaining a high charge collection efficiency by a high μτ product, as well as solar cells, electro-optic modulators, optical elements, and the like.

DESCRIPTION OF REFERENCE NUMERALS

100 CdZnTe crystal growth furnace
101 pBN crucible
102 raw material melt (growth crystal)
103 Cd for reservoir
110 growth vessel (quartz ampoule)
111 crystal growth portion
112 reservoir portion
130 heating device

What is claimed is:

1. A method for producing a cadmium zinc telluride single crystal,
    the method comprising:
        growing a cadmium zinc telluride crystal ingot;
        heating the grown cadmium zinc telluride crystal ingot as an ingot; and
        cutting out a single crystal from the heated cadmium zinc telluride crystal ingot so as to have at least one main surface of a predetermined plane orientation,
    wherein a temperature of the heating is 800° C. or higher and 1000° C. or lower, and wherein a difference between a maximum temperature and a minimum temperature in a region between an upper end portion and a lower end portion of the single crystal ingot is within 20° C., wherein
    the growing of the cadmium zinc telluride crystal ingot is carried out by a vertical temperature gradient freeze (VGF) method.

2. The method according to claim 1, wherein the heating of the cadmium zinc telluride crystal ingot is continuously carried out in a furnace in which the single crystal ingot has been grown, after growing the single crystal ingot.

3. The method according to claim 1, wherein the cadmium zinc telluride single crystal has at least one main surface, the at least one main surface having an area of 100 mm$^2$ to 1485 mm$^2$, wherein 50% or more of the at least one main surface, relative to an entirety of the at least one main surface, has a mobility lifetime product (μτ product) of $1.0 \times 10^{-3}$ cm$^2$/V or more, and wherein the main surface has a {111} plane orientation, the μτ product is measured such that radiation spectra of cobalt (Co-57) is measured when different bias voltages at two stages (250 V, 500 V, 700 V, and 900 V) are applied using a radiation detector structured by using the single crystal, a peak position of each spectrum is then measured, and the μτ product of electrons is determined using a predetermined calculation formula, and a ratio of Zn to Zn and Cd is from 2.0 at % to 10.0 at %.

* * * * *